United States Patent
Jocson et al.

(10) Patent No.: US 11,705,387 B2
(45) Date of Patent: Jul. 18, 2023

(54) MULTI-LAYER INTERCONNECTION RIBBON

(71) Applicant: Infineon Technologies AG, Neubiberg (DE)

(72) Inventors: Emil Lamco Jocson, Malacca (MY); Mohd Kahar Bajuri, Melaka (MY); Ryan Tordillo Comadre, Melaka (MY)

(73) Assignee: Infineon Technologies AG, Neubiberg (DE)

(*) Notice: Subject to any disclaimer, the term of this patent is extended or adjusted under 35 U.S.C. 154(b) by 37 days.

(21) Appl. No.: 17/010,426

(22) Filed: Sep. 2, 2020

(65) Prior Publication Data

US 2022/0068770 A1    Mar. 3, 2022

(51) Int. Cl.
*H01L 23/495* (2006.01)
*H01L 21/48* (2006.01)
*H01L 23/31* (2006.01)

(52) U.S. Cl.
CPC .... *H01L 23/49527* (2013.01); *H01L 21/4825* (2013.01); *H01L 23/3157* (2013.01); *H01L 23/49524* (2013.01); *H01L 23/49537* (2013.01); *H01L 23/49582* (2013.01)

(58) Field of Classification Search
CPC .............. H01L 23/3157; H01L 23/4821; H01L 23/4825; H01L 23/49524; H01L 23/49527; H01L 23/49537; H01L 23/49582
See application file for complete search history.

(56) References Cited

U.S. PATENT DOCUMENTS

| | | | |
|---|---|---|---|
| 5,616,520 | A | 4/1997 | Nishiuma et al. |
| 2007/0264564 | A1* | 11/2007 | Johnson .......... H01M 50/10 257/E21.001 |
| 2014/0327127 | A1 | 11/2014 | Hable et al. |

(Continued)

FOREIGN PATENT DOCUMENTS

| | | | | |
|---|---|---|---|---|
| CN | 101388375 | A * | 3/2009 | ......... H01L 23/4952 |
| CN | 111834322 | A * | 10/2020 | ....... H01L 23/46527 |

(Continued)

OTHER PUBLICATIONS

Jacques, Sebastien, "The Importance of Interconnection Technologies' Reliability of Power Electronic Packages", InTech—System Reliability, Chapter 10, 2017, p. 185-201.

*Primary Examiner* — Matthew E Warren
(74) *Attorney, Agent, or Firm* — Murphy, Bilak & Homiller, PLLC

(57) ABSTRACT

A semiconductor package assembly includes a carrier with a die attach surface and a contact pad separated from the die attach surface, a semiconductor die mounted on the die attach surface, the semiconductor die having a front side metallization that faces away from the die attach surface, an interconnect ribbon attached to the semiconductor die and the contact pad such that the interconnect ribbon electrically connects the front side metallization to the contact pad, and an electrically insulating encapsulant body that encapsulates the semiconductor die and at least part of the interconnect ribbon. The interconnect ribbon includes a layer stack of a first metal layer and a second layer formed on top of the first metal layer. The first metal layer includes a different metal as the second metal layer. The first metal layer faces the front side metallization.

17 Claims, 3 Drawing Sheets

(56) References Cited

U.S. PATENT DOCUMENTS

| | | | |
|---|---|---|---|
| 2015/0097290 A1* | 4/2015 | Liles | H01L 23/4821 |
| | | | 257/751 |
| 2017/0162403 A1* | 6/2017 | Terrill | H01L 23/3157 |
| 2020/0013692 A1 | 1/2020 | Formicone | |

FOREIGN PATENT DOCUMENTS

| | | | | |
|---|---|---|---|---|
| DE | 102010003533 A1 | 10/2011 | | |
| WO | WO-8903166 A1 * | 4/1989 | | H01L 24/50 |
| WO | 2006068643 A1 | 6/2006 | | |
| WO | 2007060144 A2 | 5/2007 | | |

\* cited by examiner

MULTI-LAYER INTERCONNECTION RIBBON

TECHNICAL FIELD

Embodiments of this invention generally relate to semiconductor packages and more particularly relate to electrical interconnect structures and techniques.

BACKGROUND

Semiconductor packages are designed to provide connective compatibility between a semiconductor die and an external apparatus, such as a printed circuit board (PCB), and to protect the semiconductor die from potentially damaging environmental conditions, such as temperature variations, moisture, dust particles, etc. Power semiconductor devices, e.g., power transistors, diodes, etc., are used in a wide variety of applications to control large currents (e.g., at least 1 ampere) and/or large voltages (e.g., at least 100 volts).

Semiconductor packages for power semiconductor devices are designed for low electrical resistance and efficient thermal dissipation. Current interconnect solutions in semiconductor packages suffer from various drawbacks. For example, bond wires provide have low current carrying capacity and thus increase package resistance. On the other hand, metal interconnect clips require large bonding surfaces.

Thus, there is a need for improved interconnect techniques in semiconductor packages.

SUMMARY

A semiconductor package assembly is disclosed. According to an embodiment, the semiconductor package assembly comprises a carrier comprising a die attach surface and a contact pad separated from the die attach surface, a semiconductor die mounted on the die attach surface, the semiconductor die comprising a front side metallization that faces away from the die attach surface, an interconnect ribbon attached to the semiconductor die and the contact pad such that the interconnect ribbon electrically connects the front side metallization to the contact pad, and an electrically insulating encapsulant body that encapsulates the semiconductor die and at least part of the interconnect ribbon. The interconnect ribbon comprises a layer stack of a first metal layer and a second layer formed on top of the first metal layer. The first metal layer comprises a different metal as the second metal layer. The first metal layer faces the front side metallization.

Separately or in combination, the first metal layer directly contacts the front side metallization.

Separately or in combination, the first metal layer is fused together with the front side metallization.

Separately or in combination, the first metal layer and the front side metallization each comprise a first metal, and the second metal layer comprises a second metal that is different than the first metal.

Separately or in combination, the first metal is Al or an alloy of Al.

Separately or in combination, the second metal is Cu or an alloy of Cu.

Separately or in combination, the second metal has a higher conductivity than the first metal, and the second metal layer is thicker than the first metal layer.

Separately or in combination, an upper surface of the ribbon is exposed at an upper surface of the encapsulant body.

Separately or in combination, the ribbon comprises a flat span that is substantially parallel to the upper surface of the encapsulant body, and the upper surface of the ribbon that is exposed comprises an upper surface area of the second metal layer in the flat span.

Separately or in combination, the carrier is a metal lead frame that comprises a die pad and a plurality of leads extending away from the die pad, the die pad comprises the die attach surface, and the contact pad is an electrical connection point to one or more of the leads of the plurality.

A method of producing a semiconductor package assembly is disclosed. According to an embodiment, the method comprises providing a carrier comprising a die attach surface and a contact pad separated from the die attach surface, mounting a semiconductor die on the die attach surface, the semiconductor die comprising a front side metallization that faces away from the die attach surface after the mounting, attaching an interconnect ribbon to the semiconductor die and the contact pad such that the interconnect ribbon electrically connects the front side metallization to the contact pad, and forming an electrically insulating encapsulant body that encapsulates the semiconductor die and at least part of the interconnect ribbon. The interconnect ribbon comprises a layer stack of a first metal layer and a second metal layer formed on top of the first metal layer. The first metal layer comprises a different metal as the second metal layer. The first metal layer faces the front side metallization after the attaching.

Separately or in combination, attaching the interconnect ribbon to the front side metallization comprises forming a direct electrical connection between the first metal layer and the front side metallization.

Separately or in combination, forming the direct electrical connection comprises fusing the first metal layer and the front side metallization together without an intermediary joining material.

Separately or in combination, fusing the first metal layer and the front side metallization together comprises an ultrasonic wirebonding process without the application of heat.

Separately or in combination, the first metal layer and the front side metallization each comprise a first metal, and the second metal layer comprises a second metal that is different than the first metal.

Separately or in combination, an upper surface of the ribbon is exposed at an upper surface of the encapsulant body after forming the encapsulant body.

Separately or in combination, the method further comprises forming a flat span in the interconnect ribbon during or after the attaching of the interconnect ribbon, and the upper surface of the ribbon that is exposed comprises an upper surface area of the second metal layer in the flat span.

Separately or in combination, forming the flat span comprises a looping technique that is performed during the attaching of the interconnect ribbon.

Separately or in combination, forming the flat span comprises compressing the interconnect ribbon during the forming of the electrically insulating encapsulant body.

Separately or in combination, forming the flat span comprises planarizing the interconnect ribbon after the forming of the electrically insulating encapsulant body.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A and FIG. 1B, illustrates an interconnect ribbon, according to an embodiment. FIG. 1A illustrates a side view of the interconnect ribbon, and FIG. 1B illustrates a cross-sectional view of the interconnect ribbon along the plane I-I' identified in FIG. 1A.

FIG. 3, which includes FIG. 3A shows a planar view of the semiconductor package assembly with an outline of an encapsulant body, and FIG. 3B shows a planar view of the semiconductor package assembly with the encapsulant body included.

DETAILED DESCRIPTION

Embodiments of a semiconductor package assembly with an interconnect ribbon that is advantageously configured for solder-free attachment and high current carrying capacity are described herein. The interconnect ribbon has a multi-layer configuration with a first metal layer and a second layer formed on top of the first metal layer. The first and second metal layers include different metals that are selected to meet different design criteria. For example, the first metal layer can include a metal that is conducive to mechanical attachment with a semiconductor die and/or contact surface. Meanwhile, the second metal layer can include a metal with a higher electrical conductivity than the first metal layer, thereby lowering the electrical resistance of the interconnect ribbon. The interconnect ribbon can be configured such that an upper surface of the ribbon is exposed from the encapsulant body. This exposed upper surface area of the ribbon can interface with an external heatsink, thereby allowing for efficient cooling of the semiconductor package assembly.

Figure 1:
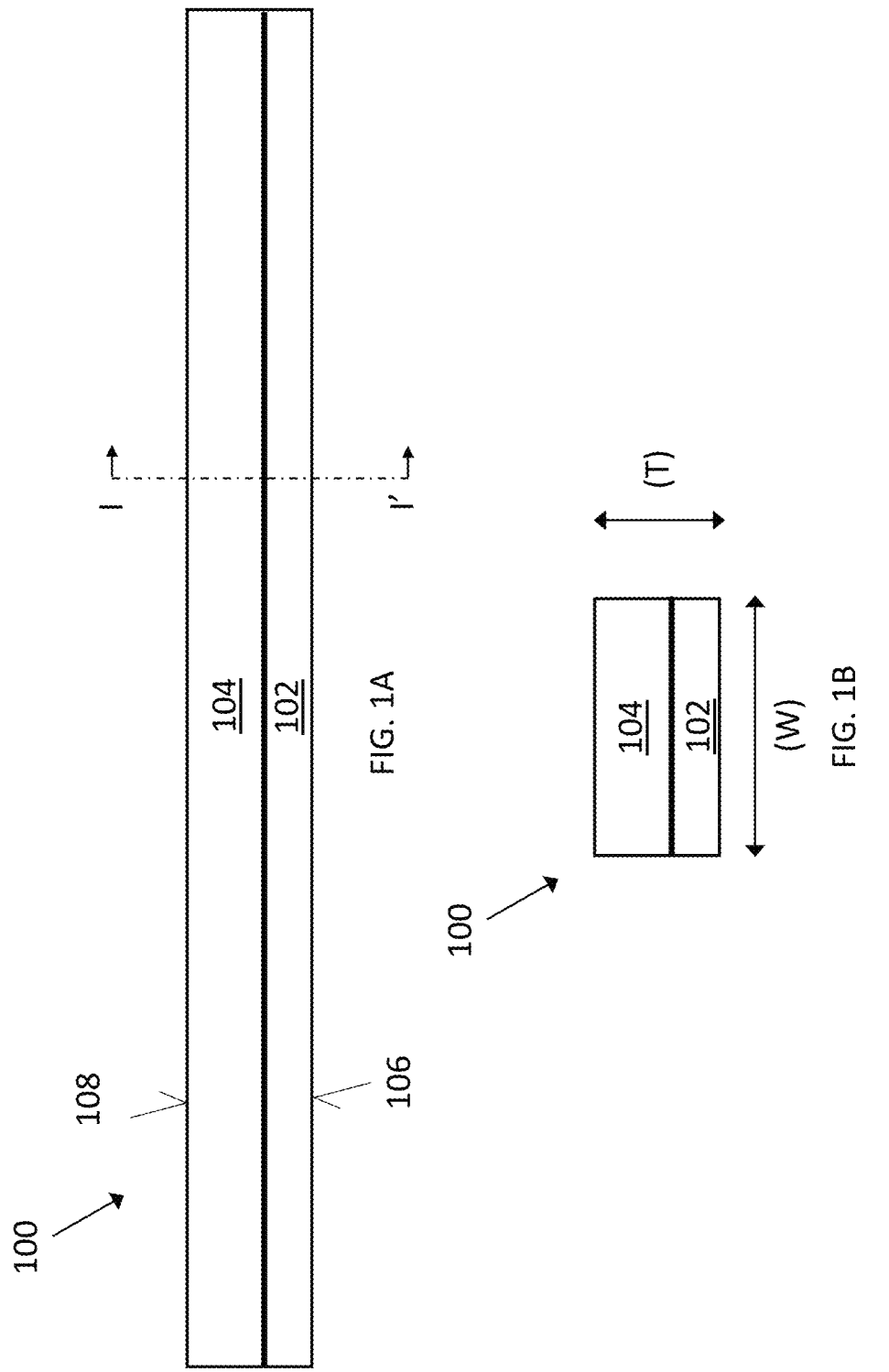
FIG. 1, which includes

Referring to FIG. 1, an interconnect ribbon 100 is depicted, according to an embodiment. The term "interconnect ribbon" refers to a specific type of electrical connector that is used to provide an electrical connection between two conductive surfaces, such as a bond pad from a semiconductor die and a bonding surface of a lead. An interconnect ribbon is formed from a conductive metal and has a flattened cross-sectional footprint with a width that exceeds its thickness. By way of comparison, another type of electrical connector that is used to provide an electrical connection between two conductive surfaces is a bond wire. A bond wire is formed from mechanically flexible conductive wires which have a circular or nearly circular cross-section. Bond wires typically have a smaller cross-sectional area than interconnect ribbons. Because of this, interconnect ribbons have greater current carrying capacity than bond wires of the same length, all other factors being equal. Another type of electrical connector that is used to provide an electrical connection between two conductive surfaces is an interconnect clip. An interconnect clip is formed from a substantially rigid slab of sheet metal. While an interconnect clip may offer greater current carrying capacity than an interconnect ribbon of the same length, all other factors being equal, it offers less mechanical versatility as its shape cannot be contoured as easily as an interconnect ribbon. Moreover, interconnect clips must typically be soldered to the contact surfaces. This adds cost and complexity to the process and requires larger bonding surfaces to account for "solder-bleed," i.e., a byproduct of soldering wherein the reflowed solder material expands out from the footprint of the soldered elements.

The interconnect ribbon 100 is provided from a strip of conductive metal, which may be wound around a spool. A width (W) of the interconnect ribbon 100 may be greater than a thickness (T) of the interconnect ribbon 100. For example, as shown in the cross-sectional view of FIG. 1B, the interconnect ribbon 100 may have an aspect ratio (i.e., the ratio of the width (W) to thickness (T)) of greater than one. In various embodiments, this aspect ratio can be on the order of 3:1, 5:1, 10:1, etc. Stated in numerical terms, the width (W) of the interconnect ribbon 100 can generally in the range of 0.5 mm-10 mm, preferably in the range of 0.5 mm-2 mm, and the thickness (T) of the interconnect ribbon 100 (while being less than the width) can generally in the range of 0.05 mm-5 mm, preferably in the range of 0.05 mm-0.4 mm, for example.

The interconnect ribbon 100 comprises a layer stack of a first metal layer 102 and a second metal layer 104 formed on top of the first metal layer 102. This means that in a cross-sectional plane of the interconnect ribbon 100 (e.g., as shown in FIG. 1B), the first and second metal layers 102, 104 are stacked on top of one another. The second metal layer 104 provides a lower surface 106 of the interconnect ribbon 100 and the first metal layer 102 provides an upper surface 108 of the interconnect ribbon 108. The lower surface 106 of the interconnect ribbon 100 may be the surface which interfaces with the contact surfaces of the elements being connected by the interconnect ribbon 100. Instead of the depicted two-layer configuration, other embodiments of the interconnect ribbon 100 comprise a layer stack with three or more metal layers stacked on top of one another in a similar manner.

The first metal layer 102 comprises a different metal as the second metal layer 104. For example, the first metal layer 102 may comprise any one or more of Al, Cu, Ni, Ag, Au, Pd, Pt, Ni, etc., and alloys thereof, and the second metal layer 104 may comprise any different one or more of Al, Cu, Ni, Ag, Au, Pd, Pt, Ni, etc., and alloys thereof. The selection of these different can be based on different criteria. For example, the first metal layer 102 can comprise a metal that is more compatible for attachment particular contact surface relative to the metal of the second metal layer 104. Meanwhile, the second metal layer 104 can comprise a metal that is more heat dissipative and/or conductive relative to the metal of the first metal layer 102. Separately or in combination, the second metal layer 104 can be thicker than the first metal layer 102. This arrangement leverages the improved conductivity as between the two layers by making the second metal layer 104 occupy the majority of the cross-sectional thickness of the interconnect ribbon 100. In a further embodiment, the second metal layer 104 can comprise a metal that is solder able, which provides the additional advantage that an external heat spreader can be soldered or attached to the second metal layer 104.

Figure 2:
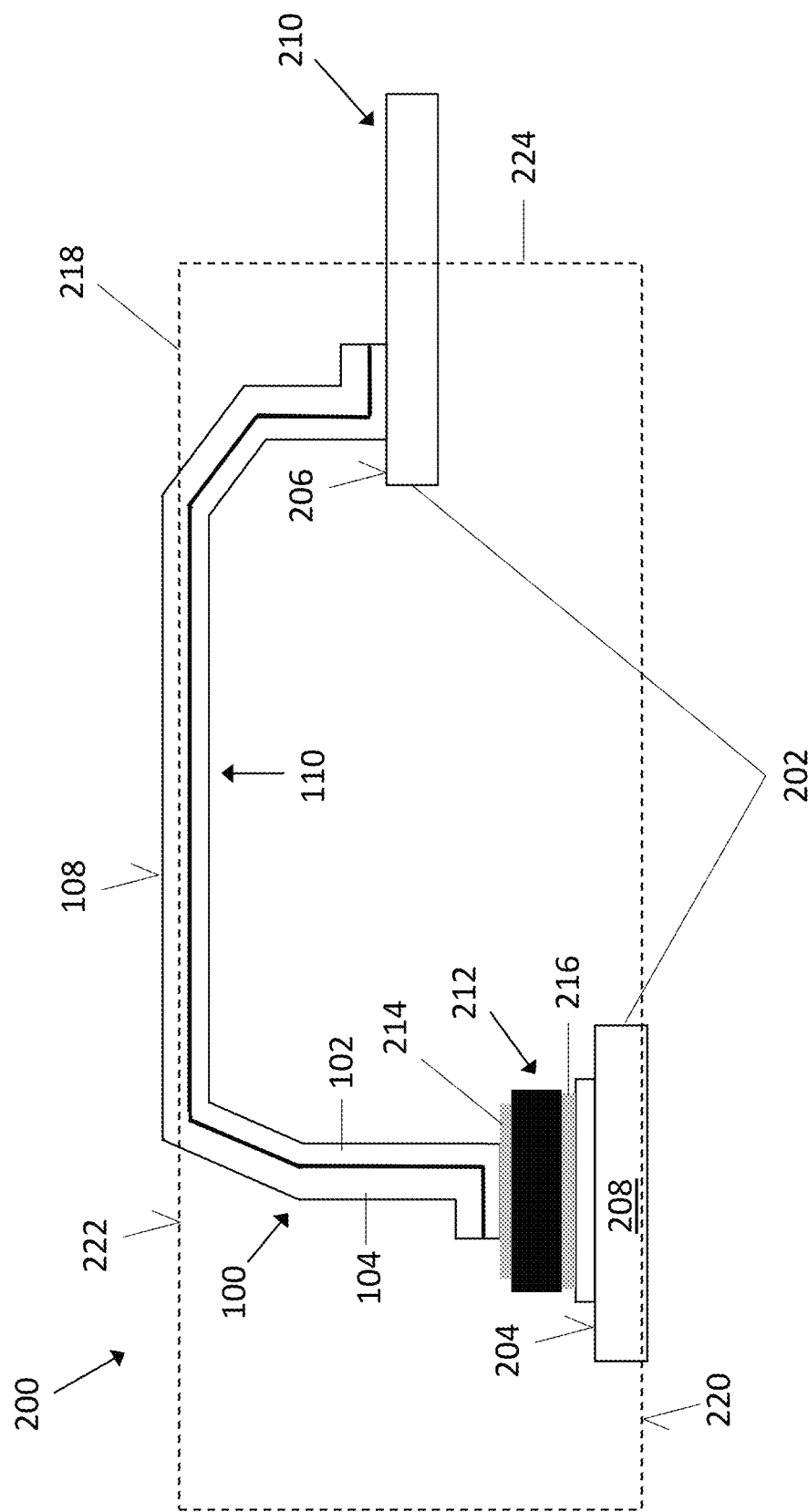
FIG. 2 illustrates a side-view of a semiconductor package assembly that includes the interconnect ribbon with an outline of an encapsulant body, according to an embodiment.
Figure 3B:
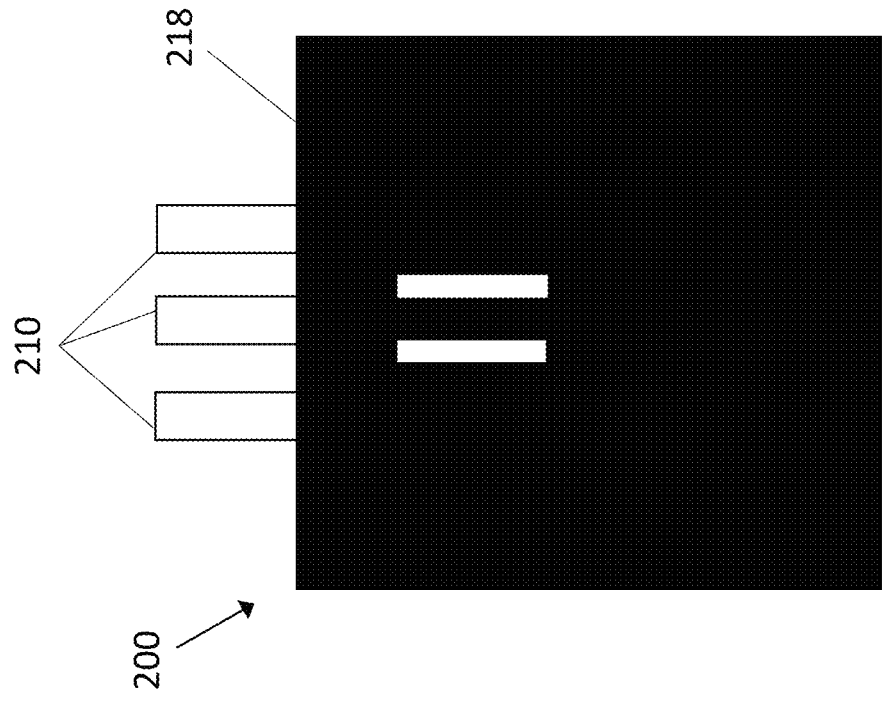
FIGS. 3A and 3B, illustrate planar views of the semiconductor package assembly, according to an embodiment.
Figure 3A:
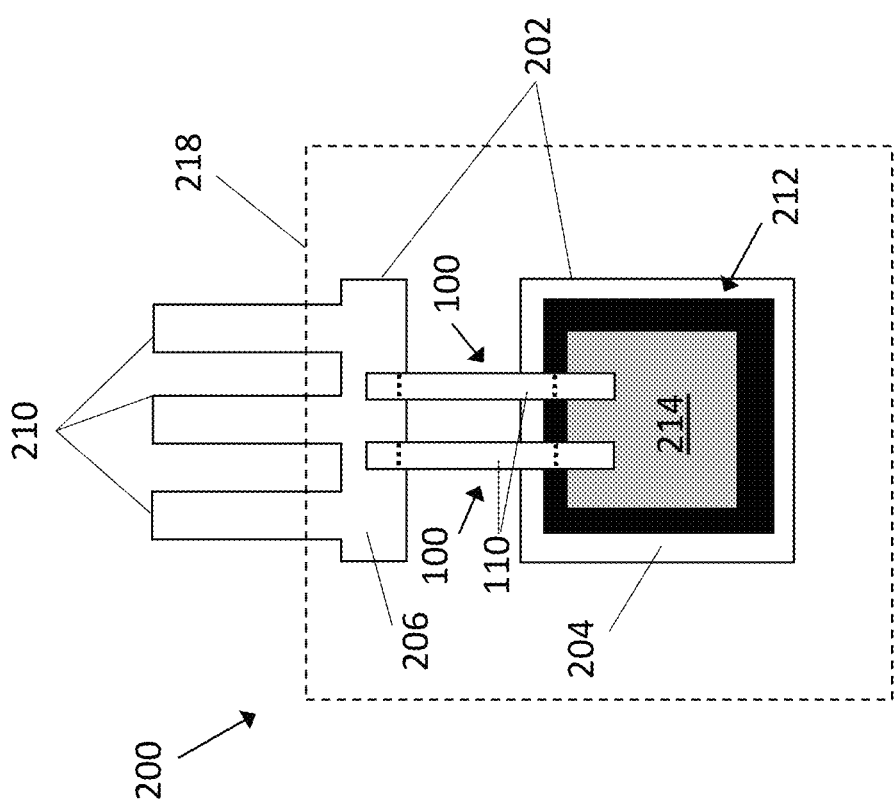

Referring to FIGS. 2 and 3, a semiconductor package assembly 200 that includes the interconnect ribbon 100 is depicted, according to an embodiment. The semiconductor package assembly 200 includes a carrier 202. The carrier 202 comprises a die attach surface 204 and a contact pad 206 that is physically separated from the die attach surface 204. The die attach surface 204 and the contact pad 206 can comprise or be plated with a variety of conductive metals such as Cu, Al, Ni, Ag, Au, Pd, Pt, Ni, etc. In the depicted embodiment, the carrier 202 is a lead frame structure which comprises a die pad 208 and a plurality of leads 210 extending away from the die pad 208. The die attach surface 204 is disposed on the die pad 208 and the contact pad is part of a structure which merges with the leads 210. The contact pad 206 can comprise bare exposed metal from the lead frame, e.g., Cu, Al, etc., or a plating layer of Ni, NiP, etc. that covers the base metal of the lead frame. In another embodiment, the carrier 202 can be a lead frame for a leadless package, which means that the leads 210 will be exposed at the bottom surface of the final leadless package.

In the depicted embodiment, the contact pad 206 and the leads 210 are vertically offset from the die attach surface 204. In other embodiments (not shown), the contact pad 206 and/or the leads 210 can be disposed on the same plane as the die attach surface 204. In the depicted embodiment, the contact pad 206 is disposed on a common pad structure that is merged with each of the leads 210. In other embodiments, the contact pad 206 may be provided by or connected to a single lead 210.

In other embodiments, the carrier 202 can be a provided global circuit carrier that accommodates multiple electronic components thereon. Examples of these global circuit carriers include PCBs (printed circuit boards) and power module substrates such as DBC (direct bonded copper) substrates, AMB (active metal brazed) substrates, etc. In that case, the die attach surface 204 and the contact pad 206 can be provided from two separate bonding pads formed on the global circuit carrier.

The semiconductor package assembly 200 comprises a semiconductor die 212 mounted on the die attach surface 204. An adhesive such as solder, sinter, tape, glue, etc., can be provided between the semiconductor die 212 and the die attach surface 204 to effectuate this bond. The semiconductor die 212 comprises a front side metallization 214 that faces away from the die attach surface 204. The front side metallization 214 is an uppermost metal layer of the semiconductor die 212 that is externally accessible. The front side metallization 214 may be structured into bond pads which provide a terminal connection (e.g., source, drain, anode, emitter, etc.) to the semiconductor die 212. The front side metallization 214 can comprise any of a variety of conductive metals such as Cu, Al, Ni, Ag, Au, Pd, Pt, Ni, etc., and alloys thereof.

Generally speaking, the semiconductor die 212 can have a wide variety of device configurations. Examples of these device configurations include discrete semiconductor devices such as transistor dies, diode dies, etc., and integrated semiconductor devices such as logic devices, controllers, sensors, etc. The semiconductor die 212 can be configured as vertical device, i.e., a device that conducts in a direction perpendicular to the main (upper) surface of the semiconductor body across a thickness of the semiconductor die 212. Alternatively, the semiconductor die 212 can be configured as lateral device, i.e., a device that conducts in a direction parallel to the main (upper) surface of the semiconductor body. The semiconductor body of the semiconductor die 212 can comprise any of a variety of semiconductor materials including type IV semiconductors, e.g., silicon, silicon germanium, silicon carbide, etc., and type III-V semiconductors, e.g., gallium nitride, gallium arsenide, etc.

According to an embodiment, the semiconductor die 212 is configured as a power device, i.e., a device that is configured to control voltages on the order of 100V or more and/or currents of 1 ampere or more. Examples of these devices include power diodes and power transistor devices such as MOSFETs (metal-oxide semiconductor field-effect transistors), IGBTs (insulated gate bipolar transistors), HEMTs (high electron mobility transistors). In these embodiments, the front side metallization 214 can comprise a load terminal of the device (e.g., source, emitter, anode, etc.). The opposite load terminal of the semiconductor die 212 (e.g., drain, collector, cathode, etc.) can be provided by the rear side metallization 216 of the semiconductor die 216. The depicted embodiment includes only one bond pad on the main surface of the semiconductor die, which may correspond to an anode or cathode of a power diode. A power transistor may have a similar configuration but with a separate control terminal (e.g., gate) provided on the main upper surface that is separately connected to a different lead.

The semiconductor package assembly 200 comprises interconnect ribbons 100 attached to the semiconductor die 212 and the contact pad 206 and providing an electrical connection between the front side metallization 214 and the contact pad 206. The depicted semiconductor package assembly 200 comprises two of the interconnect ribbons 100 connected in parallel with one another. More generally, embodiments a semiconductor package assembly 200 may include any number of the interconnect ribbons 100, e.g., one, two, three, etc. The interconnect ribbons 100 may be connected in parallel with one another (as shown) to lower the resistance of a particular electrical connection. In addition or in the alternative, multiple interconnect ribbons 100 may be used in one package to provide different electrical connections.

The interconnect ribbon 100 is arranged with the first metal layer 102 facing the front side metallization 214 and the contact pad 206. According to an embodiment, the first metal layer 102 directly contacts the front side metallization 214. In that case, the electrical connection between the interconnect ribbon 100 and the first metal layer 102 is provided by direct physical contact between these elements. In a more specific example, the first metal layer 102 is fused together with the front side metallization 214. This means that a metallic bond is (ultrasonically) provided between the metal of the first metal layer 102 and the metal of the front side metallization 214 such that these elements are cohesively joined with one another. As a result, a stable mechanical connection exists between the interconnect ribbon 100 and the front side metallization 214. The first metal layer 102 may also be fused to the contact pad 206 in a similar manner.

According to an embodiment, the first metal layer 102 and the front side metallization 214 each comprise a first metal. By forming the first metal layer 102 and the front side metallization 214 to include a common first metal, it is possible to fuse the first metal layer 102 to the front side metallization 214 using a solder-free attachment technique such as ultrasonic wedge wire bonding, the details of which will be described in further detail below. In one specific example, the first metal is Al or an alloy of Al. Meanwhile, the second metal layer 104 comprises a second metal that is different than the first metal. In one specific example, the second metal is Cu or an alloy of Cu. As the electrical conductivity of Cu is about twice that of Al, this arrangement advantageously uses the material properties of Cu to lower the resistance of the interconnect ribbon 100. The thickness of the second metal layer 104 can be greater than the first metal layer 102 to enhance the beneficial impact of the second metal on the resistance of the interconnect ribbon 100. In one example, the interconnect ribbon 100 has an overall thickness of between about 0.1 mm and 0.5 mm thick, with the second metal layer 104 having a thickness of at least 60% of the overall thickness of the interconnect ribbon 100.

The semiconductor package assembly 200 comprises an encapsulant body 218 that encapsulates the semiconductor die 212. The encapsulant body 218 comprises an electrically insulating encapsulant material that seals and protects the semiconductor die 212 and at least a portion of the interconnect ribbon 100. This encapsulant material may include epoxy materials, thermosetting plastics, etc. The encapsulant body 218 includes a lower surface 220, an upper surface 222 that is opposite from the bottom lower surface 220, and an edge surface 224 that extends between the lower and upper surfaces. In the depicted configuration, the lower surface of the die pad 208 is exposed at the lower surface 220 of the encapsulant body 218 and the leads 210 protrude from the edge surface 224, with each of these structures providing an externally accessible terminal of the package. A variety of other package configurations are possible, e.g., leadless, flat lead, bent lead, etc. In the case that the carrier 202 is a provided global circuit carrier 202, e.g., PCB, power module substrate, the encapsulant body 218 can be provided by a region of insulator such as epoxy that is formed directly on the carrier 202, or the encapsulant body 218 can be omitted altogether.

According to an embodiment, the upper surface 108 of the interconnect ribbon 100 is exposed at the upper surface 226 of the encapsulant body 218. In this arrangement, the exposed upper surface 108 of the interconnect ribbon 100 provides an interface for an external heat sink (not shown), thereby providing a thermal transmission path for the dissipation heat generated by the semiconductor die 212. To this end, the metal of the second metal layer 104 may be selected to have superior thermal performance in comparison to the first metal layer 102 and/or be well-suited to interface with an external heat sink. The above described example wherein the second metal layer 104 comprises Cu or an alloy of Cu represents one example of an advantageous material selection in this regard.

According to an embodiment, the interconnect ribbon 100 comprises a flat span 110 that is substantially parallel (e.g., within +/−5 degrees) to the upper surface 222 of the encapsulant body 218. The flat span 228 is a section of the interconnect ribbon 100 that extends along a single plane. The upper surface 108 of the interconnect ribbon 100 that is exposed comprises an upper surface area of the second metal layer 104 in the flat span 110. The upper surface 108 of the interconnect ribbon 100 run substantially parallel (e.g., within +/−5 degrees) with the upper surface 222 of the encapsulant body 218. As shown, the exposed upper surface 108 of the interconnect ribbon 100 is slightly offset from the upper surface 222 of the encapsulant body 218. In other embodiments, the exposed upper surface 108 of the interconnect ribbon 100 may be coplanar with the upper surface of the encapsulant body 218.

The semiconductor package assembly 200 can be produced according to the following technique. Initially, the carrier 202 is provided. In the case that the carrier 202 is a lead frame, the lead frame can be provided in strip format with multiple unit lead frames in each strip. Subsequently, the semiconductor die 212 is mounted on the die attach surface 204, e.g., using an adhesive such as solder, tape, etc.

After mounting the semiconductor die 212, the interconnect ribbon 100 can be attached to the front side metallization 214 and the contact pad 206. This attachment forms an electrical connection and a stable mechanical bond between the surfaces. According to an embodiment, the first metal layer 102 is fused together with the front side metallization 214 without any intermediate conductive joining material disposed between the interconnect ribbon 100 and the front side metallization 214. That is, no solder material is provided between the first metal layer 102 and the front side metallization 214. In one example of a solderless attachment technique, the front side metallization 214 and the second metal layer 104 are fused together by ultrasonic wire bonding. According to this technique, the front side metallization 214 and the second metal layer 104 are brought into direct contact with one another and sideways vibration is applied to the surfaces high frequencies above audible levels (i.e., ultrasonic). This energy induces fusing between the two regions of metal. The application of ultrasonic energy may be combined with mechanical pressure to accelerate the process. This process may be performed without the application of heat. The same technique may be used to bond the first metal layer 102 of the interconnect ribbon 100 to the contact pad 206.

After attaching the interconnect ribbon 100 to the semiconductor die 212 and the contact pad 206, an encapsulation process can be performed to form the encapsulant body 218. The encapsulant body 218 can be formed by a molding process such injection molding, transfer molding, compression molding, etc.

A variety of different techniques can be used to form the interconnect ribbon 100 to have the flat span 110 and/or to have the upper surface 108 of the interconnect ribbon 100 exposed from the upper surface 222 of the encapsulant body 218. According to one technique, the geometry of the interconnect ribbon 100 is manipulated during the attachment process, e.g., by performing a looping technique. According to this process, the process tools which attach the ribbon simultaneously manipulate it to form cornered bends in the interconnect ribbon 100, thus forming the flat span 110. The basic geometry of the interconnect ribbon 100 can remain intact during encapsulation so that the upper surface 108 of the interconnect ribbon 100 is flush against the mold cavity, and thus is exposed from the mold compound. Alternatively, or in addition, the interconnect ribbon 100 can have a bowed geometry before encapsulation, and the molding tool can compress the interconnect ribbon 100 during the formation of the encapsulant body 218 so that the upper surface of the interconnect ribbon 100 is substantially parallel to the upper surface 222 of the encapsulant body 222 after molding is complete. Alternatively, or in addition, a grinding process may be performed after forming the encapsulant body 218. According to this technique, the encapsulant body 218 is intentionally formed in a way that some of the interconnect ribbon 100 protrudes from the encapsulant body 218. To the extent that any curvature exists in the portion of the interconnect ribbon 100 that protrudes from the encapsulant body 218, this curvature can be eliminated by a planarization technique such as grinding or polishing so that the exposed upper surface of the interconnect ribbon 100 becomes substantially parallel (and optionally coplanar) with the upper surface 222 of the encapsulant body 218.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package assembly, comprising:
a carrier comprising a die attach surface and a contact pad separated from the die attach surface;
a semiconductor die mounted on the die attach surface, the semiconductor die comprising a front side metallization that faces away from the die attach surface;
an interconnect ribbon attached to the semiconductor die and the contact pad such that the interconnect ribbon electrically connects the front side metallization to the contact pad; and
an electrically insulating encapsulant body that encapsulates the semiconductor die and at least part of the interconnect ribbon,
wherein the interconnect ribbon comprises a layer stack of a first metal layer and a second layer formed on top of the first metal layer,
wherein the first metal layer comprises a different metal as the second metal layer,
wherein the first metal layer faces the front side metallization, and
wherein an upper surface of the ribbon is exposed at an upper surface of the encapsulant body.

2. The semiconductor package assembly of claim 1, wherein the first metal layer directly contacts the front side metallization.

3. The semiconductor package assembly of claim 2, wherein the first metal layer is fused together with the front side metallization.

4. The semiconductor package assembly of claim 1, wherein the first metal layer and the front side metallization each comprise a first metal, and wherein the second metal layer comprises a second metal that is different than the first metal.

5. The semiconductor package assembly of claim 4, wherein the first metal is Al or an alloy of Al.

6. The semiconductor package assembly of claim 4, wherein the second metal is Cu or an alloy of Cu.

7. The semiconductor package assembly of claim 4, wherein the second metal has a higher conductivity than the first metal, and wherein the second metal layer is thicker than the first metal layer.

8. The semiconductor package assembly of claim 1, wherein the ribbon comprises a flat span that is substantially parallel to the upper surface of the encapsulant body, and wherein the upper surface of the ribbon that is exposed comprises an upper surface area of the second metal layer in the flat span.

9. The semiconductor package assembly of claim 1, wherein the carrier is a metal lead frame that comprises a die pad and a plurality of leads extending away from the die pad, wherein the die pad comprises the die attach surface, and wherein the contact pad is an electrical connection point to one or more of the leads of the plurality.

10. A method of producing a semiconductor package assembly, the method comprising:
providing a carrier comprising a die attach surface and a contact pad separated from the die attach surface;
mounting a semiconductor die on the die attach surface, the semiconductor die comprising a front side metallization that faces away from the die attach surface after the mounting;
attaching an interconnect ribbon to the semiconductor die and the contact pad such that the interconnect ribbon electrically connects the front side metallization to the contact pad; and
forming an electrically insulating encapsulant body that encapsulates the semiconductor die and at least part of the interconnect ribbon,
wherein the interconnect ribbon comprises a layer stack of a first metal layer and a second metal layer formed on top of the first metal layer,
wherein the first metal layer comprises a different metal as the second metal layer,
wherein the first metal layer faces the front side metallization after the attaching,
wherein the first metal layer and the front side metallization each comprise a first metal, and wherein the second metal layer comprises a second metal that is different than the first metal, and
wherein an upper surface of the ribbon is exposed at an upper surface of the encapsulant body after forming the encapsulant body.

11. The method of claim 10, wherein attaching the interconnect ribbon to the front side metallization comprises forming a direct electrical connection between the first metal layer and the front side metallization.

12. The method of claim 11, wherein forming the direct electrical connection comprises fusing the first metal layer and the front side metallization together without an intermediary joining material.

13. The method of claim 12, wherein fusing the first metal layer and the front side metallization together comprises an ultrasonic wirebonding process without the application of heat.

14. The method of claim 10, further comprising forming a flat span in the interconnect ribbon during or after the attaching of the interconnect ribbon, and wherein the upper surface of the ribbon that is exposed comprises an upper surface area of the second metal layer in the flat span.

15. The method of claim 14, wherein forming the flat span comprises a looping technique that is performed during the attaching of the interconnect ribbon.

16. The method of claim 14, wherein forming the flat span comprises compressing the interconnect ribbon during the forming of the electrically insulating encapsulant body.

17. The method of claim 14, wherein forming the flat span comprises planarizing the interconnect ribbon after the forming of the electrically insulating encapsulant body.

* * * * *